(12) United States Patent
Inoue et al.

(10) Patent No.: US 9,376,617 B2
(45) Date of Patent: Jun. 28, 2016

(54) FLUORESCENT MATERIAL AND LIGHT-EMITTING DEVICE

(71) Applicant: Panasonic Intellectual Property Management Co., Ltd., Osaka (JP)

(72) Inventors: Osamu Inoue, Osaka (JP); Kojiro Okuyama, Nara (JP); Mitsuru Nitta, Osaka (JP); Seigo Shiraishi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/855,174

(22) Filed: Sep. 15, 2015

(65) Prior Publication Data

US 2016/0115386 A1 Apr. 28, 2016

(30) Foreign Application Priority Data

Oct. 23, 2014 (JP) ................... 2014-216003

(51) Int. Cl.
*H01L 33/00* (2010.01)
*C09K 11/77* (2006.01)
*H01L 33/50* (2010.01)

(52) U.S. Cl.
CPC ......... *C09K 11/7794* (2013.01); *C09K 11/7736* (2013.01); *H01L 33/502* (2013.01)

(58) Field of Classification Search
None
See application file for complete search history.

(56) References Cited

U.S. PATENT DOCUMENTS

| | | | | |
|---|---|---|---|---|
| 8,188,492 B2* | 5/2012 | Lee | ............... | C09K 11/7734 257/100 |
| 2004/0145307 A1* | 7/2004 | Odaki | ............ | C01G 39/006 313/512 |
| 2005/0274930 A1* | 12/2005 | Roth | ............... | C09K 11/58 252/301.4 R |
| 2005/0274972 A1* | 12/2005 | Roth | ............... | C09K 11/7734 257/100 |
| 2006/0028117 A1* | 2/2006 | Cho | ............... | C09K 11/7734 313/486 |
| 2008/0001122 A1* | 1/2008 | Odaki | ............ | C09K 11/7736 252/301.5 |
| 2010/0244066 A1* | 9/2010 | Chiu | ............... | C09K 11/7794 257/98 |

FOREIGN PATENT DOCUMENTS

| | | |
|---|---|---|
| JP | 2003-041252 | 2/2003 |
| JP | 2004-231770 | 8/2004 |
| JP | 2004-359842 | 12/2004 |
| JP | 2005-054159 | 3/2005 |
| JP | 2006-028445 | 2/2006 |
| JP | 2006-045575 | 2/2006 |
| JP | 2007-254517 | 10/2007 |
| JP | 2008-007644 | 1/2008 |
| JP | 2008-291203 | 12/2008 |
| JP | 2010-229388 | 10/2010 |

* cited by examiner

*Primary Examiner* — Ha Tran T Nguyen
*Assistant Examiner* — Jordan Klein
(74) *Attorney, Agent, or Firm* — McDermott Will & Emery LLP

(57) ABSTRACT

A fluorescent material according to an aspect of the present disclosure mainly comprises a compound represented by $AB_{0.5-w-x-y-z}C_wEu_xSm_yLn_zW_{0.5}O_3$. A is one or more elements selected from the group consisting of alkaline earth metals and mainly contains Ca. B is one or more elements selected from the group consisting of divalent metals and mainly contains Mg. C is one or more elements selected from the group consisting of alkali metals and mainly contains Li, Na, or Li and Na. Ln is one or more elements selected from the group consisting of rare earth elements excluding Eu and Sm. w, x, y, and z meet the following conditions: $0.05 \leq w \leq 0.25$, $0.05 \leq x+y \leq 0.25$, $0.0 \leq y \leq 0.02$, and $w = x+y+z$.

8 Claims, 2 Drawing Sheets

FLUORESCENT MATERIAL AND LIGHT-EMITTING DEVICE

BACKGROUND

1. Technical Field

The present disclosure relates to a fluorescent material and a light-emitting device that incorporates a fluorescent material.

2. Description of the Related Art

Devices that produce white light with the use of a light-emitting diode (LED), called white LEDs, are known. A typical white LED has a blue LED chip and a phosphor that emits yellow light by absorbing part of light emitted from this blue LED chip.

A combination of an LED chip that emits near-ultraviolet to violet lights and a phosphor is under development as a high emission-energy light source.

This light source can be used as, for example, a light source for projectors or automotive headlamps.

Japanese Unexamined Patent Application Publication No. 2008-7644 discloses that a phosphor represented by $Ca_{2-2x}Li_xEu_xW_2O_8$ can be excited using near-ultraviolet to blue lights and thereby emit red light, with $Eu^{3+}$ as emission center.

Japanese Unexamined Patent Application Publication No. 2004-359842 discloses that a phosphor that contains Eu and Sm produces a red light of high intensity, particularly when exposed to an excitation light around 405 nm.

SUMMARY

One non-limiting and exemplary embodiment provides a fluorescent material that offers high emission efficiency and maintains its luminance even at high temperatures.

A fluorescent material according to an aspect of the present disclosure mainly comprises a compound represented by $AB_{0.5-w-x-y-z}C_wEu_xSm_yLn_zW_{0.5}O_3$. A is one or more elements selected from the group consisting of alkaline earth metals and mainly contains Ca. B is one or more elements selected from the group consisting of divalent metals, and mainly contains Mg. C is one or more elements selected from the group consisting of alkali metals and mainly contains Li, Na, or Li and Na. Ln is one or more elements selected from the group consisting of rare earth elements excluding Eu and Sm. w, x, y, and z meet the following conditions: $0.05 \le w \le 0.25$, $0.05 \le x+y \le 0.25$, $0.0 \le y \le 0.02$, and $w=x+y+z$.

According to an aspect of the present disclosure, there is provided a fluorescent material that offers high emission efficiency and maintains its luminance even at high temperatures.

It should be noted that comprehensive or specific embodiments may be implemented as a system, a method, a device, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
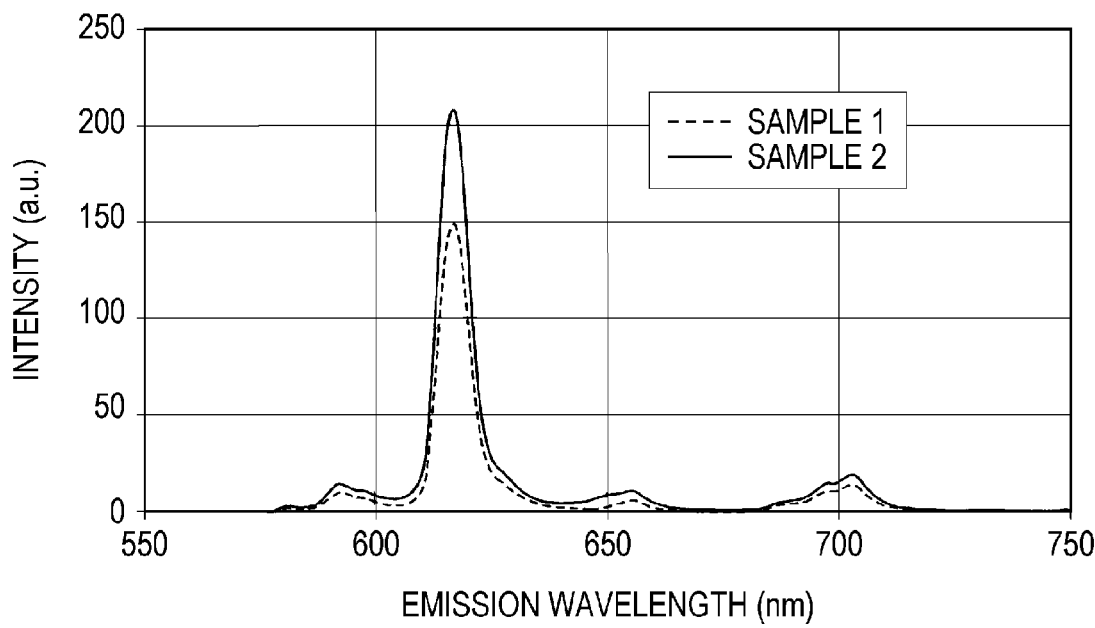
FIG. 1 is a graph that shows emission spectra concerning fluorescent materials according to some Examples.

The following describes an embodiment of the present disclosure. The following description is merely for illustrative purposes and does not limit the present disclosure. Any necessary change may be made to an embodiment of the present disclosure within the technical scope of the disclosure.

[Fluorescent Material]

This section describes a fluorescent material according to this embodiment.

A fluorescent material according to this embodiment mainly comprises a compound represented by $AB_{0.5-w-x-y-z}C_wEu_xSm_yLn_zW_{0.5}O_3$. A is one or more elements selected from the group consisting of alkaline earth metals. A mainly contains Ca. B is one or more elements selected from the group consisting of divalent metals. B mainly contains Mg. C is one or more elements selected from the group consisting of alkali metals. C mainly contains Li, Na, or Li and Na. Ln is one or more elements selected from the group consisting of rare earth elements excluding Eu and Sm. w, x, y, and z are numeric values that meet the following conditions: $0.05 \le w \le 0.25$, $0.05 \le x+y \le 0.25$, $0.0 \le y \le 0.02$, and $w=x+y+z$.

In the present disclosure, the expression "mainly comprising a compound" means comprising the compound in the concentration of 90 mass % or more.

In the present disclosure, the compound represented by the above chemical formula may be referred to as "the main component". Any other compound contained in the fluorescent material, if any, may be referred to as "an accessory component". The fluorescent material contains 90 mass % or more of the main component. The quantity of the main component in the fluorescent material may also be, for example, 95 mass % or more. Hereinafter, for simplification, "the main component contained in the fluorescent material" may be simply referred to "the fluorescent material."

The expression "A mainly contains Ca" means that A contains 90 at % or more Ca. The term "at %" refers to atomic percent. "B mainly contains Mg" means that B contains 90 at % or more Mg. "C mainly contains Li, Na, or Li and Na" means that C contains 90 at % or more Li or Na or that the total atomic percent of Li and Na to C is 90 at % or more.

The emission spectrum of the fluorescent material peaks in a range of, for example, 580 nm to 750 nm inclusive. The emission spectrum of the fluorescent material peaks in a range of, for example, 600 nm to 700 nm inclusive.

The fluorescent material is based on, for example, $CaMg_{0.5}W_{0.5}O_3$. In this case Ca corresponds to element A in the above chemical formula, and Mg to element B. In order to impart fluorescent property to this base substance, a part of divalent Ca or Mg site thereof, particularly Mg site, is substituted with trivalent Eu (europium) acting as an emission center. In addition, the substance is made to contain the same number of atoms of monovalent Li and/or Na as Eu, to compensate for change in the valence thereof due to the substitution.

Besides $Eu^{3+}$, the fluorescent material may contain $Sm^{3+}$. A fluorescent material that contains $Eu^{3+}$ and $Sm^{3+}$ has potential to offer higher emission efficiency than one that contains no $Sm^{3+}$ when excited by an excitation light at a wavelength of 405 nm.

In addition to Eu and Sm, the fluorescent material may contain, for example, any other a trivalent rare earth element Ln. When the fluorescent material contains a rare earth element Ln, an alkali metal C compensates for the difference in charge due to the presence of Ln. The total atomic percent of Eu, Sm, and Ln in the main component is therefore equal to the atomic percent of the alkali metal C. In other words, the numeric values w, x, y, and z meet the condition w=x+y+z.

Element A mainly contains Ca. This can increase the emission efficiency of the fluorescent material and prevent the drop in luminance at high temperatures. Element A may auxiliary contain at least one element selected from the group consisting of Mg, Sr, and Ba.

Element B mainly contains Mg. This can increase the emission efficiency of the fluorescent material and prevent the drop in luminance at high temperatures. Element B may auxiliarily contain any divalent metal other than Mg, such as Zn.

Element C mainly contains Li, Na, or Li and Na, desirably Li. This increases the emission efficiency of the fluorescent material. Element C may auxiliarily contain any alkali metal other than Li and Na, such as K, Rb, or Cs.

An example of element Ln is Gd, a rare earth element having an ionic radius close to that of $Eu^{3+}$. Element Ln may also be, for example, Y. The use of any such element can increase the emission efficiency of the fluorescent material. In addition, it can lead to a lower firing temperature requirement when the fluorescent material is produced in the form of a sintered body.

w, x, y, and z are numeric values that meet the following conditions: $0.05 \leq w \leq 0.25$, $0.05 \leq x+y \leq 0.25$, $0.0 \leq y \leq 0.02$, and w=x+y+z. Such a combination of w, x, y, and z can increase the emission efficiency of the fluorescent material and prevent the drop in luminance at high temperatures, compared with a combination that does not meet these conditions.

The numeric value y, which represents the Sm content of the main component, may be 0.0. In other words, the main component may be free of Sm.

The fluorescent material is excited by, for example, a light at a wavelength of 405 nm emitted from an LED or a laser diode (LD), which are both readily available. If the fluorescent material containing Sm is excited by such the light, the emission efficiency thereof can be considerably increased. It is desirable that the numeric value y meet the condition $0.002 \leq y \leq 0.015$.

The numeric value 0.5-w-x-y-z, which represents the quantity of element B in the main component, may be 0.0. In other words, the main component may be free of element B. In fact, therefore, the expression "B mainly contains Mg" in the present disclosure makes sense only when the main component contains element B.

It is desirable that the numeric values w, x, y, and z further meet the following conditions: $0.10 \leq x+y \leq 0.20$ and $0.002 \leq y \leq 0.015$. This can increase the emission efficiency of the fluorescent material and further prevent the drop in luminance at high temperatures.

The fluorescent material may contain at least one compound selected from the group consisting of alkali metal fluorides, alkaline earth metal fluorides, and alkali metal oxides as an accessory component, with the accessory component content being 0.5 mol % or more and 5.0 mol % or less. The presence of any of these compounds can increase the emission efficiency of the fluorescent material. Alkali metal fluorides, in particular, lithium fluoride (LiF), are desirable accessory components compared to the other compounds listed. The use of any accessory component can increase the emission efficiency of the fluorescent material. In addition, it can lead to a lower firing temperature requirement when the fluorescent material is produced in the form of a sintered body.

It is desirable that in the main component, A contain Ca only, B contain Mg only, C contain Li only, and Ln be Gd. This can increase the emission efficiency of the fluorescent material and further prevent the drop in luminance at high temperatures.

The fluorescent material may be, for example, a sintered body, which is obtained by molding raw material powders and sintering the molded body. This can improve the absorption of excitation light into the fluorescent material, and accordingly increase the emission efficiency of the material, by reducing the effects of light scattering. Even in the form of a sintered body, the fluorescent material allows part of excitation light to pass through if the thickness of the sintered body is sufficiently small. The density of the sintered body is, for example, $5.0 \text{ g/cm}^3$ or more, desirably $5.5 \text{ g/cm}^3$. Increasing the density of the sintered body leads to higher emission efficiency, resulting in higher permeability of the fluorescent material to light.

When the fluorescent material is a sintered body, the presence of any of the accessory components listed above helps the sintered body to be dense, thereby enabling the emission efficiency to be increased. In particular, the sintered fluorescent material containing LiF can considerably increase the emission efficiency thereof.

The fluorescent material may contain a small amount of any accessory component other than the above-listed ones unless it affects the characteristics of the material. Examples of such extra accessory components include oxides, chloride, and fluorides.

The proportions of elements in the composition of the main component of the fluorescent material may be slightly different from their desired proportions unless the characteristics of the material are affected. For example, if the proportion of a certain element in the main component is somewhat higher than its desired proportion, then the main component contains more of this element than needed. If this excess of the element is so small that the characteristics of the fluorescent material are not affected, this fluorescent material may be an example of a fluorescent material according to the present disclosure.

[Method for Producing a Fluorescent Material]

This section describes a method for producing a fluorescent material according to this embodiment. The method for producing a fluorescent material according to this embodiment can be any of a solid-phase process, a liquid-phase process, and a gas-phase process.

In a solid-phase process, raw material powders containing the metals are mixed, and then the resulting mixture is heated at a predetermined temperature to make the raw materials react.

In a liquid-phase process, a solution containing the metals (or metallic ions) is first prepared. Then this solution is treated to make a precipitate separate out or applied to a substrate and dried. The resulting substance is then heated at a predetermined temperature, yielding a solid.

Examples of gas-phase processes include vapor deposition, sputtering, and CVD. These processes produce a solid film.

Fluorescent materials are typically used in the form of a powder. If the fluorescent material is produced in the form of a sintered body, therefore, the use of a solid-phase process reduces the production cost.

Examples of raw material powders used in a solid-phase process include powders of metal oxides and powders of metal carbonates. The raw material powders are mixed using, for example, a ball mill, and then the resulting mixture is heated in an electric furnace to make the raw materials react. The heating of the mixture may be performed in an inert gas atmosphere, such as a $N_2$ gas atmosphere. The heat treatment may be carried out in an air atmosphere because Eu emits light in its trivalent state. When the fluorescent material is produced in the form of a sintered body, it is possible to shape a mixed raw material powder into an article before sintering. For example, a mixed raw material powder may be heated before sintering. This can remove any unnecessary component, such as carbon dioxide, from the raw material powder and can turn the raw material powder into a fluorescent powder. The shaping of the powder can be conducted using, for example, sheet shaping or molding.

A fluorescent material according to this embodiment is an oxide-based material containing the aforementioned main component, which allows the heat treatment for obtaining it to be performed in an air atmosphere. This can make the production of fluorescent materials easier and can also make it less costly.

A fluorescent material according to this embodiment is excited by near-ultraviolet to blue lights. For example, it can be excited by an excitation light at a wavelength of 405 nm. The main emission peak of the fluorescent material is in a wavelength range of, for example, 616 nm to 618 nm inclusive, in which lights are highly visible.

A fluorescent material according to this embodiment maintains its luminance even at high temperatures. For example, the fluorescent material does not lose much of its luminance even when excited using a high-intensity excitation light source, such as an LD.

A fluorescent material according to this embodiment may have much shorter afterglow than other $Eu^{3+}$-containing fluorescent materials. For example, the duration from its peak luminance to 1/10 of it may be on the order of 0.5 to 0.7 msec. The emission spectrum of a fluorescent material according to this embodiment varies little with temperature. The luminance maintenance ratio (described hereinafter) of the material is therefore almost equal to the maintenance ratio of photons.

[Light-Emitting Device]

This section describes an embodiment relating to a light-emitting device. The light-emitting device has an excitation light source and an aforementioned fluorescent material. The excitation light source emits an excitation light and therefore the fluorescent material absorbs the excitation light to emit light. Examples of the excitation light source include an LED and an LD. This light-emitting device can be used as, for example, a light source for projectors, automotive headlamps, or white LED lights.

The excitation light source is, for example, a semiconductor light emitter that emits an excitation light that has a peak wavelength in a wavelength range of 380 nm to 470 nm inclusive. The fluorescent material absorbs the excitation light to emit red light. The semiconductor light emitter has, for example, a light-emitting layer made of a gallium nitride-based semiconductor. The excitation spectrum of a fluorescent material according to this embodiment has a peak wavelength in, for example, at least one of the following wavelength ranges: more than 360 nm to less than 370 nm, more than 380 nm to less than 390 nm, more than 390 nm to less than 400 nm, more than 400 nm to less than 410 nm, more than 410 nm to less than 420 nm, and more than 460 nm to less than 470 nm. The excitation spectrum of a fluorescent material according to this embodiment peaks at, for example, around 364 nm, around 384 nm, around 397 nm, around 408 nm, around 418 nm, and around 467 nm. When an excitation light source emits a light having a wavelength close to any of these, emission efficiency of the fluorescent material can be increased.

The light-emitting device may further have a green fluorescent material and a blue fluorescent material. The green fluorescent material may be composed of multiple fluorescent particles that absorb the excitation light to emit green light. The blue fluorescent material is composed of multiple fluorescent particles that absorb the excitation light to emit blue light. The light-emitting device may have one, two, three, four, or more fluorescent materials.

When used as a component of a white LED light, a light-emitting device according to this embodiment may have, for example, a blue LED chip as an excitation light source, a fluorescent material according to this embodiment, and a green fluorescent material. Alternatively, the light-emitting device may have, for example, a near-ultraviolet LED chip as an excitation light source, a fluorescent material according to this embodiment, a green fluorescent material, and a blue fluorescent material.

The light-emitting device may have any structure, and any method can be used to produce the light-emitting device. For example, examples of a light-emitting device according to the embodiment include a device having the same structure as a known white LED light device except a fluorescent material.

EXAMPLES

The following describes some examples of a fluorescent material according to the present disclosure and some comparative examples.

[Samples 1 and 2]

This section describes the method used to prepare samples 1 and 2. As raw material powders for the main component, powders of $CaCO_3$, $MgCO_3$ (magnesium carbonate basic), $Li_2CO_3$, $Eu_2O_3$, $Sm_2O_3$, $WO_3$, and LiF, all special grade or higher quality, were prepared. The $CaCO_3$, $MgCO_3$, $Li_2CO_3$, $Eu_2O_3$, $Sm_2O_3$, and $WO_3$ powders were weighed to the proportions of Ca, Mg, Li, Eu, Sm, and W in the composition of the main component in Table 1. The LiF powder was weighed to make the molar percent of LiF relative to the sample 1.5 mol %. These raw material powders were wet-mixed with purified water in a ball mill. The resulting mixture was dried at 120° C. into a mixed powder. The mixed powder was calcined in the air at 800° C. in a crucible for 2 hours. The calcined powder was wet-milled with purified water in a ball mill. The obtained substance was dried at 120° C., yielding a milled powder. The milled powder was fired in the air at 1000° C. in a crucible for 3 hours. In this way, samples 1 and 2 were obtained. The main composition of the fluorescent materials obtained as samples 1 and 2 had a composition represented by $AB_{0.5-w-x-y-z}C_wEu_xSm_yLn_zW_{0.5}O_3$. Table 1 summarizes the elements contained in samples 1 and 2 and their proportions in the composition. Samples 1 and 2 contained no Ln (z=0). Entries of "Ex" in the Remarks column mean that samples 1 and 2 are examples of a fluorescent material according to this embodiment.

TABLE 1

| | Composition of the main component (relative numbers of atoms) | | | | | Accessory component | | |
|---|---|---|---|---|---|---|---|---|
| | A | B | C | Eu | Sm | W | (mol %) | Remarks |
| Sample 1 | Ca = 1.0 | Mg = 0.25 | Li = 0.125 | 0.125 | 0 | 0.5 | LiF = 1.5 | Ex |
| Sample 2 | Ca = 1.0 | Mg = 0.25 | Li = 0.125 | 0.115 | 0.01 | 0.5 | LiF = 1.5 | Ex |

The emission spectrum from 550 nm to 750 nm of samples 1 and 2 was measured using a spectrofluorometer (JASCO FP-6500) under the following conditions: excitation wavelength, 405 nm; excitation bandwidth, 3 nm; fluorescence bandwidth, 1 nm; data interval, 1 nm; scan speed, 500 nm/min. FIG. 1 illustrates the measured emission spectra. In FIG. 1, the vertical axis shows emission intensity (a.u., arbitrary unit), and the horizontal axis shows emission wavelength (nm).

Figure 2:
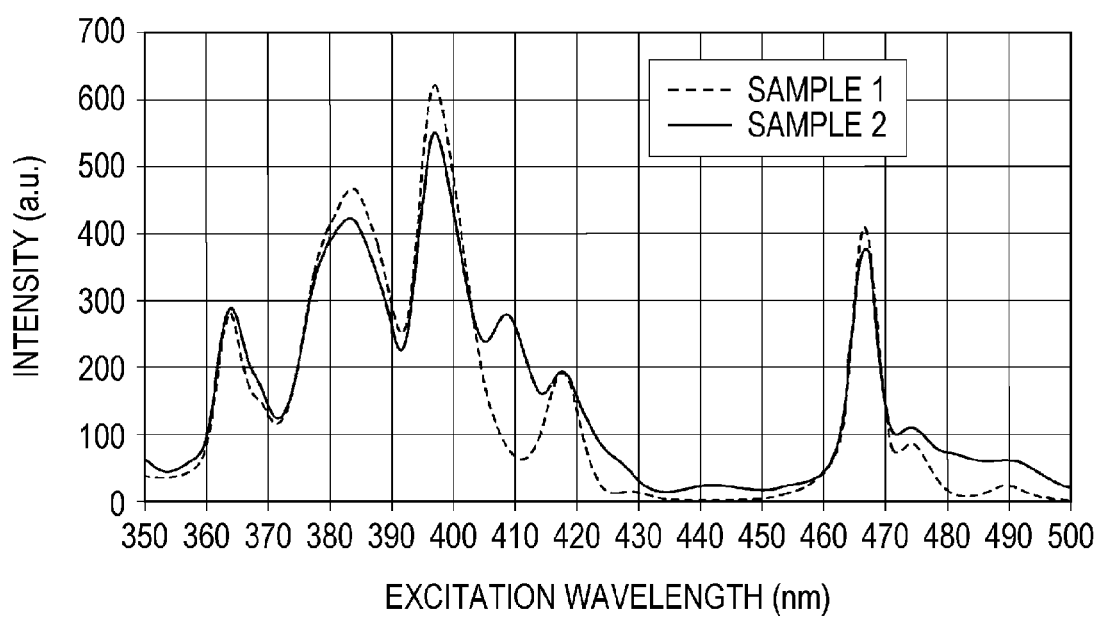
FIG. 2 is a graph that shows excitation spectra concerning fluorescent materials according to some Examples.

The excitation spectrum from 350 nm to 500 nm of samples 1 and 2 was measured at an emission wavelength of 617 nm using the same spectrofluorometer under the following conditions: excitation bandwidth, 3 nm; fluorescence bandwidth, 1 nm; data interval, 1 nm; scan speed, 500 nm/min. FIG. 2 illustrates the measured excitation spectra. In FIG. 2, the vertical axis shows emission intensity (a.u.), and the horizontal axis shows excitation wavelength (nm).

Figure 3:
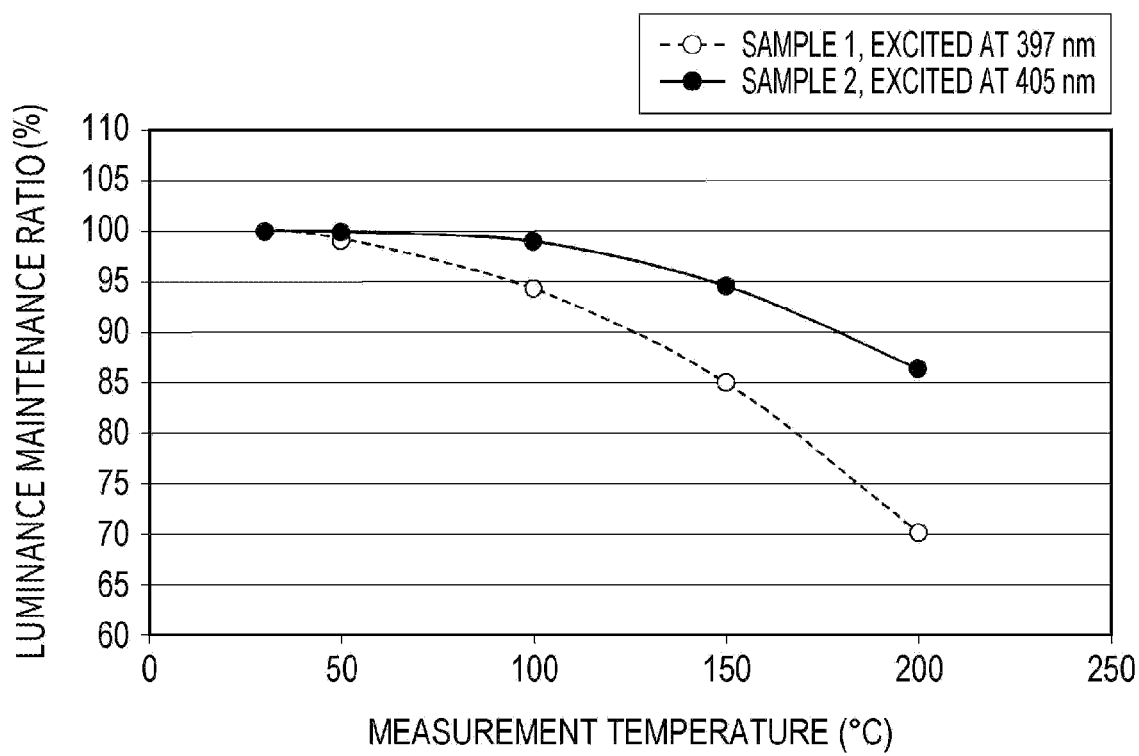
FIG. 3 is a graph that shows the relationship between luminance maintenance ratio and temperature concerning fluorescent materials according to some Examples.

Sample 1 was excited using an excitation light at a wavelength of 397 nm, and the luminance of the emitted light was measured using the same spectrofluorometer while the temperature of sample 1 was varied in a range of 30° C. to 200° C. Likewise, sample 2 was excited using an excitation light at a wavelength of 405 nm, and the luminance of the emitted light was measured using the same spectrofluorometer while the temperature of sample 2 was varied in a range of 30° C. to 200° C. For each sample, the luminance maintenance ratio $M_t$ (%) at a particular temperature t (° C.) in the range of 30° C. to 200° C. was determined using a relationship $M_t=100\times CD_t/CD_{30}$, where $CD_{30}$ denotes the luminance of the light emitted from the sample at 30° C., and $CD_t$ denotes the luminance of the light emitted from the sample at t (° C.). FIG. 3 illustrates the relationship between the luminance maintenance ratio and measurement temperature of each sample.

One gram each of samples 1 and 2 were excited at two excitation wavelengths, 397 nm and 405 nm, and then their internal quantum efficiency (IQE), percent absorption of excitation light (Abs.), and external quantum efficiency (EQE) were measured using an absolute PL quantum yield measurement system (Hamamatsu Photonics C9920). The EQE is the product of the IQE and the Abs. Table 2 summarizes the results of measurement. Table 2 also includes the luminance maintenance ratio of each sample at 200° C.

TABLE 2

| | | Emission efficiency | | | Luminance |
|---|---|---|---|---|---|
| | Excitation wavelength | IQE | Abs. | EQE | maintenance ratio at 200° C. |
| Sample 1 | 397 nm | 94.4% | 34.4% | 32.5% | 70.2% |
| Sample 1 | 405 nm | 93.3% | 10.3% | 9.6% | — |
| Sample 2 | 397 nm | 93.7% | 32.3% | 30.3% | — |
| Sample 2 | 405 nm | 90.8% | 20.0% | 18.2% | 86.4% |

Sample 1 contained no Sm, whereas sample 2 contained Sm. As illustrated in FIG. 1, samples 1 and 2 provided a similar emission spectrum when excited using an excitation light at a wavelength of 405 nm, and the emission spectrum showed the main peak around a wavelength of 617 nm. The emission intensity of sample 2 was higher than that of sample 1. As can be seen from FIG. 2, the excitation spectrum of sample 1 peaked around wavelengths of 364 nm, 384 nm, 397 nm, 418 nm, and 467 nm, whereas that of sample 2 peaked not only around these wavelengths, but also around wavelengths of 408 nm to 409 nm.

As demonstrated in Table 2, sample 1 exhibited a much lower Abs. with an excitation light at a wavelength of 405 nm than with an excitation light at a wavelength of 397 nm. In contrast, the Abs. sample 2 exhibited with an excitation light at a wavelength of 405 nm was not much lower than that with an excitation light at a wavelength of 397 nm. This indicates that sample 2 can be efficiently excited using a light at a wavelength of 405 nm emitted from, for example, an LED chip or a semiconductor laser.

The results of the measurement of sample 1 suggest that a fluorescent material exhibits a high EQE in response to an excitation light around a wavelength of 384 nm, 397 nm, 418 nm, or 467 nm when its main component contains no Sm. The results of the measurement of sample 2 suggest that a fluorescent material exhibits a high EQE in response to an excitation light at a wavelength of 405 nm, i.e., the wavelength of light that readily available light sources emit, when its main component contains Sm.

When a fluorescent material contains both Eu and Sm, it is usual that $Sm^{3+}$ absorbs a light around 405 nm and $Eu^{3+}$ emits light. However, the excitation spectrum of sample 2, illustrated in FIG. 2, peaked in a range of 408 nm to 409 nm, or at wavelengths slightly longer than 405 nm, and declined to a minimum around 405 nm. In other words, sample 2 exhibited a shift to longer wavelengths in a peak for the absorption of light by $Sm^{3+}$. This makes sample 2 seemingly disadvantageous compared to other phosphors that have a peak for the absorption of light by $Sm^{3+}$ around 405 nm, but the emission wavelength of an LED or an LD typically increases by approximately 2 to 3 mm with increasing ambient temperature. This means that even if an excitation light source emits a light at a wavelength of 405 nm at room temperature (e.g., 15° C. to 30° C., typically 25° C.), this light source may emit a light at a wavelength of 407 to 408 nm in practical use. In such a situation, other phosphors whose excitation spectrum peaks around 405 nm may have their emission efficiency greatly affected due to a wavelength shift associated with an ambient temperature rise and/or the temperature characteristics of the phosphor. In contrast, a Sm-containing fluorescent material according to this embodiment can maintain high emission efficiency even if the excitation wavelength shifts from 405 nm to shorter or longer wavelengths by a few nanometers, in addition to offering sufficiently high emission efficiency in response to an excitation light at a wavelength of 405 nm.

As can be seen from FIG. 3 and Table 2, sample 1 exhibited a luminance maintenance ratio of 85.1% at 150° C. and 70.2% at 200° C. when excited using an excitation light at a wavelength of 397 nm. Sample 1 therefore performed well in terms of luminance maintenance ratio. Sample 2 exhibited a luminance maintenance ratio of 94.6% at 150° C. and 86.4% at 200° C. when excited using an excitation light at a wavelength of 405 nm. Sample 2 therefore performed better in terms of luminance maintenance ratio.

[Samples 3 to 42]

This section describes the method used to prepare samples 3 to 42. As raw material powders for samples 3 to 42, powders of $SrCO_3$, $BaCO_3$, ZnO, $Na_2CO_3$, $K_2CO_3$, $Gd_2O_3$, $Y_2O_3$, $MoO_3$, NaF, KF, $MgF_2$, and $Li_2CO_3$, all special grade or higher quality, were prepared as well as the raw material powders for samples 1 and 2, and some of them were used as necessary. For each sample, the selected raw material powders were weighed to the proportions of elements in the composition of the main component and the accessory component content in Table 3. These raw material powders were wet-mixed with purified water in a ball mill. The resulting mixture was dried at 120° C. into a mixed powder. The mixed powder was calcined in the air at 800° C. in a crucible for 2 hours. The calcined powder was wet-milled with purified water in a ball mill. The obtained substance was dried at 120° C. In this way, milled powders for samples 3 to 42 were obtained. These milled powders were pressed using a 20-mm diameter mold into multiple articles per powder. Each of the obtained articles was fired for 4 hours at any of the following temperatures: 900° C., 950° C., 1000° C., 1050° C., 1100° C., 1150° C., 1200° C., 1250° C., and 1300° C. This yielded multiple sintered bodies with different compositions and sintering conditions.

The IQE, Abs., and EQE of these sintered bodies were measured using the aforementioned absolute PL quantum yield measurement system. Each row of Table 4 shows the measured IQE, Abs., and EQE of the sintered body that exhibited the highest EQE in a group of sintered bodies sharing the same composition but produced with different firing temperatures, along with the firing temperature for the indicated sintered body. For those samples in Table 4 that displayed an EQE exceeding 30.0%, the luminance maintenance ratio at 200° C. was determined in the same way as that of samples 1 and 2 using an excitation light at a wavelength of 405 nm. The determined luminance maintenance ratio is summarized in Table 4. In Tables 3 and 4, entries of "Ex" in the Remarks column mean that the samples are examples, whereas entries of "CEx" mean that the samples are comparative examples.

TABLE 3

| | Composition of the main component (relative numbers of atoms) | | | | | | | Accessory component (mol %) | Remarks |
|---|---|---|---|---|---|---|---|---|---|
| | A | B | C | Ln | Eu | Sm | W or Mo | | |
| Sample 3 | Ca = 1.0 | Mg = 0.25 | Li = 0.125 | — | 0.125 | — | W = 0.50 | LiF = 1.5 | Ex |
| Sample 4 | Ca = 1.0 | Mg = 0.25 | Li = 0.125 | — | 0.115 | 0.01 | W = 0.50 | LiF = 1.5 | Ex |
| Sample 5 | Ca = 1.0 | Mg = 0.42 | Li = 0.04 | — | 0.03 | 0.01 | W = 0.50 | LiF = 1.5 | CEx |
| Sample 6 | Ca = 1.0 | Mg = 0.40 | Li = 0.05 | — | 0.04 | 0.01 | W = 0.50 | LiF = 1.5 | Ex |
| Sample 7 | Ca = 1.0 | Mg = 0.30 | Li = 0.10 | — | 0.09 | 0.01 | W = 0.50 | LiF = 1.5 | Ex |
| Sample 8 | Ca = 1.0 | Mg = 0.20 | Li = 0.15 | — | 0.14 | 0.01 | W = 0.50 | LiF = 1.5 | Ex |
| Sample 9 | Ca = 1.0 | Mg = 0.16 | Li = 0.17 | — | 0.16 | 0.01 | W = 0.50 | LiF = 1.5 | Ex |
| Sample 10 | Ca = 1.0 | Mg = 0.10 | Li = 0.20 | — | 0.19 | 0.01 | W = 0.50 | LiF = 1.5 | Ex |
| Sample 11 | Ca = 1.0 | — | Li = 0.25 | — | 0.24 | 0.01 | W = 0.50 | LiF = 1.5 | Ex |
| Sample 12 | Ca = 1.0 | Mg = 0.16 | Li = 0.17 | — | 0.17 | — | W = 0.50 | LiF = 1.5 | Ex |
| Sample 13 | Ca = 1.0 | Mg = 0.16 | Li = 0.17 | — | 0.168 | 0.002 | W = 0.50 | LiF = 1.5 | Ex |
| Sample 14 | Ca = 1.0 | Mg = 0.16 | Li = 0.17 | — | 0.167 | 0.003 | W = 0.50 | LiF = 1.5 | Ex |
| Sample 15 | Ca = 1.0 | Mg = 0.16 | Li = 0.17 | — | 0.166 | 0.004 | W = 0.50 | LiF = 1.5 | Ex |
| Sample 16 | Ca = 1.0 | Mg = 0.16 | Li = 0.17 | — | 0.164 | 0.006 | W = 0.50 | LiF = 1.5 | Ex |
| Sample 17 | Ca = 1.0 | Mg = 0.16 | Li = 0.17 | — | 0.158 | 0.012 | W = 0.50 | LiF = 1.5 | Ex |
| Sample 18 | Ca = 1.0 | Mg = 0.16 | Li = 0.17 | — | 0.155 | 0.015 | W = 0.50 | LiF = 1.5 | Ex |
| Sample 19 | Ca = 1.0 | Mg = 0.16 | Li = 0.17 | — | 0.15 | 0.02 | W = 0.50 | LiF = 1.5 | Ex |
| Sample 20 | Ca = 1.0 | Mg = 0.16 | Li = 0.17 | — | 0.145 | 0.025 | W = 0.50 | LiF = 1.5 | CEx |
| Sample 21 | Mg = 1.0 | Mg = 0.16 | Li = 0.17 | — | 0.16 | 0.01 | W = 0.50 | LiF = 1.5 | CEx |
| Sample 22 | Sr = 1.0 | Mg = 0.16 | Li = 0.17 | — | 0.16 | 0.01 | W = 0.50 | LiF = 1.5 | CEx |
| Sample 23 | Ba = 1.0 | Mg = 0.16 | Li = 0.17 | — | 0.16 | 0.01 | W = 0.50 | LiF = 1.5 | CEx |
| Sample 24 | Ca = 0.9, Mg = 0.1 | Mg = 0.16 | Li = 0.17 | — | 0.16 | 0.01 | W = 0.50 | LiF = 1.5 | Ex |
| Sample 25 | Ca = 0.9, Sr = 0.1 | Mg = 0.16 | Li = 0.17 | — | 0.16 | 0.01 | W = 0.50 | LiF = 1.5 | Ex |
| Sample 26 | Ca = 1.0 | Zn = 0.16 | Li = 0.17 | — | 0.16 | 0.01 | W = 0.50 | LiF = 1.5 | CEx |
| Sample 27 | Ca = 1.0 | Mg = 0.08 | Li = 0.21 | Gd = 0.04 | 0.16 | 0.01 | W = 0.50 | LiF = 1.5 | Ex |
| Sample 28 | Ca = 1.0 | — | Li = 0.25 | Gd = 0.08 | 0.16 | 0.01 | W = 0.50 | LiF = 1.5 | Ex |
| Sample 29 | Ca = 1.0 | — | Li = 0.25 | Y = 0.08 | 0.16 | 0.01 | W = 0.50 | LiF = 1.5 | Ex |
| Sample 30 | Ca = 1.0 | Mg = 0.16 | Na = 0.17 | — | 0.16 | 0.01 | W = 0.50 | LiF = 1.5 | Ex |
| Sample 31 | Ca = 1.0 | Mg = 0.16 | K = 0.17 | — | 0.16 | 0.01 | W = 0.50 | LiF = 1.5 | CEx |
| Sample 32 | Ca = 1.0 | Mg = 0.16 | Li = 0.17 | — | 0.16 | 0.01 | Mo = 0.50 | LiF = 1.5 | CEx |
| Sample 33 | Ca = 1.0 | Mg = 0.16 | Li = 0.17 | — | 0.16 | 0.01 | W = 0.50 | — | Ex |
| Sample 34 | Ca = 1.0 | Mg = 0.16 | Li = 0.17 | — | 0.16 | 0.01 | W = 0.50 | NaF = 1.5 | Ex |
| Sample 35 | Ca = 1.0 | Mg = 0.16 | Li = 0.17 | — | 0.16 | 0.01 | W = 0.50 | KF = 1.5 | Ex |
| Sample 36 | Ca = 1.0 | Mg = 0.16 | Li = 0.17 | — | 0.16 | 0.01 | W = 0.50 | $MgF_2$ = 1.5 | Ex |
| Sample 37 | Ca = 1.0 | Mg = 0.16 | Li = 0.17 | — | 0.16 | 0.01 | W = 0.50 | $Li_2O$ = 1.5 | Ex |
| Sample 38 | Ca = 1.0 | Mg = 0.16 | Li = 0.17 | — | 0.16 | 0.01 | W = 0.50 | LiF = 0.3 | Ex |
| Sample 39 | Ca = 1.0 | Mg = 0.16 | Li = 0.17 | — | 0.16 | 0.01 | W = 0.50 | LiF = 0.5 | Ex |
| Sample 40 | Ca = 1.0 | Mg = 0.16 | Li = 0.17 | — | 0.16 | 0.01 | W = 0.50 | LiF = 3.0 | Ex |
| Sample 41 | Ca = 1.0 | Mg = 0.16 | Li = 0.17 | — | 0.16 | 0.01 | W = 0.50 | LiF = 5.0 | Ex |
| Sample 42 | Ca = 1.0 | Mg = 0.16 | Li = 0.17 | — | 0.16 | 0.01 | W = 0.50 | LiF = 7.0 | Ex |

TABLE 4

| | Firing temperature (° C.) | Emission efficiency (%) | | | Luminance maintenance ratio (%) | Remarks |
|---|---|---|---|---|---|---|
| | | IQE | Abs. | EQE | | |
| Sample 3 | 1000 | 89.7 | 43.3 | 38.9 | 80.8 | Ex |
| Sample 4 | 1000 | 80.6 | 66.1 | 53.3 | 81.9 | Ex |
| Sample 5 | 1000 | 64.8 | 38.3 | 24.8 | — | CEx |
| Sample 6 | 1000 | 73.5 | 47.9 | 35.2 | 85.0 | Ex |
| Sample 7 | 1000 | 79.6 | 63.8 | 50.8 | 82.6 | Ex |
| Sample 8 | 1000 | 82.2 | 67.0 | 55.1 | 81.3 | Ex |
| Sample 9 | 1000 | 82.6 | 67.2 | 55.5 | 80.5 | Ex |
| Sample 10 | 1000 | 83.3 | 65.4 | 54.5 | 79.2 | Ex |
| Sample 11 | 950 | 84.5 | 43.0 | 36.3 | 72.9 | Ex |
| Sample 12 | 1000 | 91.9 | 44.8 | 41.2 | 80.2 | Ex |
| Sample 13 | 1000 | 91.6 | 54.6 | 50.0 | 82.3 | Ex |
| Sample 14 | 1000 | 91.1 | 58.6 | 53.4 | 82.7 | Ex |
| Sample 15 | 1000 | 90.4 | 60.5 | 54.7 | 83.1 | Ex |
| Sample 16 | 1000 | 88.5 | 63.6 | 56.3 | 82.6 | Ex |
| Sample 17 | 1000 | 76.8 | 69.3 | 53.2 | 78.9 | Ex |
| Sample 18 | 1000 | 68.3 | 70.9 | 48.4 | 77.0 | Ex |
| Sample 19 | 1000 | 53.2 | 71.7 | 38.1 | 75.2 | Ex |
| Sample 20 | 1000 | 38.0 | 72.4 | 27.5 | — | CEx |
| Sample 21 | 1000 | 17.7 | 14.7 | 2.6 | — | CEx |
| Sample 22 | 1300 | 41.4 | 43.5 | 18.0 | — | CEx |
| Sample 23 | 1300 | 0.9 | 77.1 | 0.7 | — | CEx |
| Sample 24 | 1000 | 83.2 | 66.4 | 55.3 | 82.9 | Ex |
| Sample 25 | 1000 | 82.1 | 65.1 | 53.4 | 79.6 | Ex |
| Sample 26 | 1000 | 76.9 | 39.7 | 30.5 | 34.6 | CEx |
| Sample 27 | 950 | 74.3 | 65.6 | 48.7 | 79.4 | Ex |
| Sample 28 | 900 | 88.1 | 45.1 | 39.7 | 74.0 | Ex |
| Sample 29 | 900 | 77.6 | 43.0 | 33.4 | 70.8 | Ex |
| Sample 30 | 1050 | 94.1 | 42.5 | 40.0 | 79.6 | Ex |
| Sample 31 | 1300 | 74.2 | 26.6 | 19.7 | — | CEx |
| Sample 32 | 1200 | 7.5 | 84.1 | 6.3 | — | CEx |
| Sample 33 | 1300 | 64.1 | 47.7 | 30.6 | 77.9 | Ex |
| Sample 34 | 1050 | 83.3 | 53.0 | 44.2 | 79.4 | Ex |
| Sample 35 | 1200 | 82.7 | 39.9 | 33.0 | 78.5 | Ex |
| Sample 36 | 1200 | 79.0 | 46.4 | 36.7 | 78.8 | Ex |
| Sample 37 | 1200 | 83.6 | 51.2 | 42.8 | 78.7 | Ex |
| Sample 38 | 1100 | 68.2 | 49.7 | 33.9 | 79.0 | Ex |
| Sample 39 | 1000 | 78.5 | 60.9 | 47.8 | 79.7 | Ex |
| Sample 40 | 1000 | 81.4 | 67.9 | 55.3 | 80.3 | Ex |
| Sample 41 | 1000 | 80.6 | 67.0 | 54.0 | 80.1 | Ex |
| Sample 42 | 1000 | 80.3 | 66.5 | 53.4 | 80.2 | Ex |

Samples 1 and 2 shared the same proportions of elements in the composition of the main component and the same accessory component content with samples 3 and 4, respectively. However, samples 1 and 2 were not sintered, whereas samples 3 and 4 were sintered bodies. Comparing the results for samples 1 and 2 in Table 2 and those for samples 3 and 4 in Table 4 revealed that the sintered fluorescent materials exhibited a higher Abs. and a higher EQE than the unsintered ones.

Samples 5 to 11 were different from sample 4 in terms of the proportion of Eu, and therefore the proportions of Mg and Li, in the composition of the main component. When the main component is represented by a general formula $AB_{0.5-w-x-y-z}C_wEu_xSm_yLn_zW_{0.5}O_3$, x denotes the proportion of Eu in the composition of the main component, and y denotes the proportion of Sm in the composition of the main component. An expression x+y therefore represents the sum of the proportions of Eu and Sm in the composition of the main component. According to Tables 3 and 4, the EQE of sample 5 (x+y=0.04) was less than 30%, whereas that of samples 4 and 6 to 11 (0.05≤x+y≤0.25) was more than 30%, demonstrating high emission efficiency. Samples 4 and 7 to 10 (0.10≤x+y≤0.20) displayed an EQE of more than 50% and a luminance maintenance ratio of more than 75%. Sample 9 (x+y=0.17) exhibited the highest EQE among samples 4 to 11.

Samples 12 to 20 shared the same x+y, the sum of the proportions of Eu and Sm, with sample 9, but were different from sample 9 in terms of the proportion y of Sm and therefore the proportion x of Eu. The EQE of sample 20 (y=0.025) was less than 30%, whereas that of samples 9 and 12 to 19 (0≤y≤0.02) was more than 30%, and that of sample 12 (y=0) exceeded 40%. Sample 16 (y=0.006) exhibited the highest EQE among samples 12 to 20. The range of y desirable when the wavelength of excitation light is 405 nm was therefore found to be 0.002 to 0.015 inclusive.

Samples 21 to 25 were different from sample 9 in that element A of the main component contained any alkaline earth metal other than Ca. The EQE of samples 21 to 23, in which element A contained a non-Ca alkaline earth metal only, was considerably lower than that of sample 9. The EQE of samples 24 and 25, in which element A contained mainly Ca and partly another alkaline earth metal, was comparable to that of sample 9. It was therefore found that the presence of a non-Ca alkaline earth metal, such as Mg or Sr, as part of element A in the main component is acceptable as long as element A mainly contains Ca.

Sample 26 was different from sample 9 in that element B of the main component was Zn. Sample 26 exhibited a considerably lower EQE and a lower luminance maintenance ratio than sample 9. This revealed that when the main component contains element B, element B needs to contain Mg. The inventors' further research has found that the fluorescent material can have good characteristics when element B contains 90 at % or more Mg.

Samples 27 to 29 were different from sample 9 in that a rare earth element other than Eu and Sm was contained. To be more specific, sample 27 contained Gd, and the proportion of Mg in its main component was lower than that of sample 9. Sample 28 contained Gd and did not contain Mg. Sample 29 contained Y and did not contain Mg. The proportion of Li in the composition of the main component of samples 27 to 29 was higher than that of sample 9 in accordance with the Mg content and the Gd or Y content. Although lower than those of sample 9, the EQE and luminance maintenance ratio of samples 27 to 29 exceeded 30% and 70%, respectively. Sample 27, which contained Mg in the main component, exhibited a higher EQE and a higher luminance maintenance ratio than samples 28 and 29, which contained no Mg in the main component. In Table 4, the firing temperature for samples 27 and 29 was lower than for sample 9. In table 4, the firing temperature for samples 28 and 29, which contained no Mg in the main component, was lower than that for sample 27, which contained Mg in the main component.

Samples 30 and 31 were different from sample 9 in that element C of the main component was Na and K, respectively. Although lower and slightly lower than those of sample 9, the EQE and luminance maintenance ratio of sample 30 exceeded 40% and 75%, respectively. The EQE of sample 31 was considerably lower than that of sample 9. It was therefore found that element C in the main component of the fluorescent material needs to contain Li or Na. Furthermore, these results suggest that element C may contain Li and Na together. The inventors' further research has found that the fluorescent material can have good characteristics when element C contains 90 at % or more Li or Na or a total of 90 at % or more of Li and Na.

Sample 32 was different from sample 9 in that the main component contained Mo instead of W. The EQE of sample 32 was considerably lower than that of sample 9.

Sample 33 was different from sample 9 in that it contained no accessory component. Samples 34 to 37 contained different accessory components from that in sample 9. To be more specific, samples 34, 35, 36, and 37 contained NaF, KF, $MgF_2$, and $Li_2O$, respectively, as an accessory component. Comparing sample 33 and samples 34 to 37 in Table 4 revealed that samples 34 to 37, which contained an accessory component, were fired at a lower temperature and exhibited a higher EQE than sample 33, which contained no accessory component. A comparison across samples 34 to 37 in Table 4 indicated that sample 34, which contained NaF as an accessory component, was fired at a lower temperature and exhibited a higher EQE than samples 35 to 37, which contained a different accessory component. Comparing sample 9 and samples 34 to 37 in Table 4 revealed that sample 9, which contained LiF as an accessory component, was fired at a lower temperature and exhibited a higher EQE than samples 34 to 37, which contained a different accessory component.

Samples 38 to 42 were different from sample 9 in terms of the quantity of LiF as an accessory component. According to the results for samples 38 to 42, the EQE was high at a LiF content of 0.5 mol % or more, and leveled off at 3.0 mol %. It is therefore desirable that the quantity of LiF as an accessory component be 0.5 mol % or more and 5.0 mol % or less.

[LED-Based Light-Emitting Device]

This section describes an LED-based light-emitting device as an example of a light-emitting device according to the present disclosure.

The mixed powder used in the preparation of sample 2 was added to dimethyl silicone resin to make the mixed powder content 10 mass %. The materials were kneaded using a three-roll kneader, yielding an uncured phosphor-resin mixture.

An LED chip that emits a light having a central wavelength of 405 nm was then prepared, and the top of this LED chip was coated with the phosphor-resin mixture. The phosphor-resin mixture was thermally cured. In this way, an LED-based light-emitting device was produced.

When the LED chip was turned on, red light was produced by the LED-based light-emitting device.

A fluorescent material according to the present disclosure can be used as, for example, a component of a light source that incorporates a light-emitting diode (LED) or a laser diode (LD) and a phosphor. Such a light source can be used as a light source for projectors, automotive headlamps, or white LED lights.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A fluorescent material mainly comprising a compound represented by $AB_{0.5-w-x-y-z}C_w Eu_x Sm_y Ln_z W_{0.5} O_3$, where:
   A is one or more elements selected from the group consisting of alkaline earth metals and mainly contains Ca;
   B is one or more elements selected from the group consisting of divalent metals and mainly contains Mg;
   C is one or more elements selected from the group consisting of alkali metals and mainly contains Li, Na, or Li and Na;
   Ln is one or more elements selected from the group consisting of rare earth elements excluding Eu and Sm; and
   w, x, y, and z meet the following conditions:
   $0.05 \leq w \leq 0.25$;
   $0.05 \leq x+y \leq 0.25$;
   $0.0 \leq y \leq 0.02$; and
   $w = x+y+z$.

2. The fluorescent material according to claim 1, wherein w, x, y, and z further meet the following conditions:
   $0.10 \leq x+y \leq 0.20$; and
   $0.002 \leq y \leq 0.015$.

3. The fluorescent material according to claim 1, further comprising
   0.5 mol % or more and 5.0 mol % or less of at least one compound selected from the group consisting of alkali metal fluorides, alkaline earth metal fluorides, and alkali metal oxides.

4. The fluorescent material according to claim 3, wherein the at least one compound is lithium fluoride.

5. The fluorescent material according to claim 1, wherein B contains Mg only, C contains Li or Na only, and Ln is Gd or Y.

6. The fluorescent material according to claim 1, wherein A contains Ca only, B contains Mg only, C contains Li only, and Ln is Gd.

7. The fluorescent material according to claim 1, wherein the fluorescent material is a sintered body.

8. A light-emitting device comprising:
   an excitation light source; and
   a fluorescent material that emits light by absorbing excitation light emitted from the excitation light source,
   the fluorescent material mainly comprising a compound represented by $AB_{0.5-w-x-y-z}C_w Eu_x Sm_y Ln_z W_{0.5} O_3$, where:
   A is one or more elements selected from the group consisting of alkaline earth metals and mainly contains Ca;
   B is one or more elements selected from the group consisting of divalent metals, mainly Mg;
   C is one or more elements selected from the group consisting of alkali metals and mainly contains Li, Na, or Li and Na;
   Ln is one or more elements selected from the group consisting of rare earth elements excluding Eu and Sm; and
   w, x, y, and z meet the following conditions:
   $0.05 \leq w \leq 0.25$;
   $0.05 \leq x+y \leq 0.25$;
   $0.0 \leq y \leq 0.02$; and
   $w = x+y+z$.

* * * * *